US006620673B1

(12) United States Patent
LaFleur

(10) Patent No.: US 6,620,673 B1
(45) Date of Patent: Sep. 16, 2003

(54) THIN FILM CAPACITOR HAVING MULTI-LAYER DIELECTRIC FILM INCLUDING SILICON DIOXIDE AND TANTALUM PENTOXIDE

(75) Inventor: Mike LaFleur, San Jose, CA (US)

(73) Assignee: Alpine Microsystems, Inc.

( * ) Notice: Subject to any disclaimer, the term of this patent is extended or adjusted under 35 U.S.C. 154(b) by 0 days.

(21) Appl. No.: 10/093,961

(22) Filed: Mar. 8, 2002

(51) Int. Cl.[7] .................................. H01L 21/8242
(52) U.S. Cl. .................. 438/240; 438/253; 438/396; 438/386; 438/243
(58) Field of Search .................. 438/243, 240, 438/250–258, 393–399, 386; 257/318

(56) References Cited

U.S. PATENT DOCUMENTS

| | | | |
|---|---|---|---|
| 4,868,619 A | * 9/1989 | Mukherjee et al. ......... 257/300 |
| 5,135,889 A | 8/1992 | Allen | |
| 5,583,739 A | 12/1996 | Vu et al. | |
| 5,633,785 A | 5/1997 | Parker et al. | |
| 5,729,047 A | 3/1998 | Ma | |
| 5,731,235 A | 3/1998 | Srinivasan et al. | |
| 5,872,697 A | 2/1999 | Christensen et al. | |
| 5,874,770 A | 2/1999 | Saia et al. | |
| 5,879,572 A | 3/1999 | Folsom et al. | |
| 5,882,978 A | 3/1999 | Srinivasan et al. | |
| 5,906,965 A | 5/1999 | Rao | |
| 5,936,831 A | 8/1999 | Kola et al. | |
| 5,973,910 A | 10/1999 | Gardner | |
| 6,005,648 A | 12/1999 | Zhang et al. | |
| 6,075,711 A | 6/2000 | Brown et al. | |
| 6,077,754 A | 6/2000 | Srinivasan et al. | |
| 6,097,454 A | 8/2000 | Zhang et al. | |
| 6,117,732 A | * 9/2000 | Chu et al. ................... 438/264 |
| 6,207,489 B1 | 3/2001 | Nam et al. | |
| 6,226,171 B1 | 5/2001 | Beilin et al. | |
| 6,228,702 B1 | 5/2001 | Hirota | |
| 6,235,572 B1 | 5/2001 | Kunitomo et al. | |
| 6,392,268 B2 | * 5/2002 | Ishige ......................... 257/316 |
| 6,479,342 B1 | * 11/2002 | Inaba ......................... 438/239 |

FOREIGN PATENT DOCUMENTS

WO     WO 98/18303     4/1998

OTHER PUBLICATIONS

Herrell, Dennis. *Processors Put Pressure on Packages: A Review of the Packages Housing Modern PC Processors*, Microdesign Resources. Microprocessor Report, Dec. 27, 1999, pp. 12–15.

* cited by examiner

Primary Examiner—John F. Niebling
Assistant Examiner—Jennifer M. Kennedy
(74) Attorney, Agent, or Firm—Kenneth C. Brooks

(57) ABSTRACT

A capacitor and a method of forming the same, one embodiment of which includes depositing a multi-layer dielectric film between first and second spaced-apart electrodes. The multi-layer dielectric film includes first and second layers that have differing roughness. The layer of the dielectric film having the least amount of roughness is disposed adjacent to the first electrode. After depositing the second layer of the dielectric film adjacent to the first layer, the second layer is annealed. An exemplary embodiment of the thin film capacitor forms the dielectric material from silicon dioxide ($SiO_2$) and tantalum pentoxide ($Ta_2O_5$).

20 Claims, 2 Drawing Sheets

THIN FILM CAPACITOR HAVING MULTI-LAYER DIELECTRIC FILM INCLUDING SILICON DIOXIDE AND TANTALUM PENTOXIDE

FIELD OF THE INVENTION

The present invention relates to a method for manufacturing a semiconductor thin film capacitor. More particularly, the present invention is directed to a method for manufacturing a thin film capacitor having a dielectric film formed of tantalum oxide.

BACKGROUND OF THE INVENTION

The operational characteristics of thin film capacitors become increasingly important as the operation frequency of the various circuits in which these capacitors are included increases. Examples of such circuits include dynamic random access memories, in which the thin-film capacitor is employed as a storage cell; filters, in which the thin-film capacitor forms part of an RC network; and multi-chip modules, in which the thin-film capacitor is employed as a decoupling capacitor.

Operational characteristics that are desirable for a thin-film capacitor include high-capacitance density, low current leakage and a high breakdown voltage. In addition, it is desirable that the capacitors be compatible with subsequent steps during manufacturing of the circuit.

Due to its excellent dielectric properties, extensive efforts have been made to make capacitors using Tantalum Pentoxide ($Ta_2O_5$) films deposited by reactive sputtering, chemical vapor deposition (CVD), and plasma enhanced chemical vapor deposition. As described in U.S. Pat. No. 6,235,572 to Kunitomo et al., tantalum pentoxide films are generally deposited in an amorphous state. To improve the dielectric constant of the tantalum pentoxide, the films are subjected to a thermal treatment to give the film a crystalline structure. The crystalline structure of tantalum pentoxide films present a thin poly-crystal film having a grain boundary that is subject to current leakage between electrodes disposed on opposite sides thereof. Although increasing the film thickness may reduce the leakage current and increase the capacitance, too great an increase exacerbates leakage current due to the increased stress it places on the tantalum pentoxide film. To reduce current leakage while maintaining sufficient capacitance, Kunitomo et al. advocate forming a multi-layered tantalum pentoxide film employing CVD techniques.

U.S. Pat. No. 5,936,831 to Kola et al., recognizes that capacitors fabricated with anodized reactively sputtered $Ta_2O_5$ films were found to have satisfactory leakage and breakdown properties, but degraded upon thermal annealing above 200° C. The degradation demonstrated irreversible increases in the temperature coefficient of capacitance (TCC), as well as the dissipation factor. These are believed to be caused by diffusion of electrode metal atoms into the dielectric and diffusion of oxygen out, creating oxygen deficiency defects. To overcome this degradation, Kola et al. discuss using a variety of metals for the electrodes, including aluminum (Al), chromium (Cr), copper (Cu), tantalum nitride ($TaN_x$), titanium nitride ($TiN_x$) and tungsten (W). As a result, Kola et al. advocate forming a thin-film capacitor with a dielectric formed from nitrogen or silicon-doped tantalum oxide and at least one electrode formed from chromium by anodically oxidizing TaN or $Ta_2Si$ and forming a Cr electrode.

U.S. Pat. No. 6,207,489 to Nam et al., discloses a method for manufacturing a capacitor having a dielectric film formed from tantalum oxide. The method includes forming a lower electrode that is electrically connected to an active region of a semiconductor substrate. A pre-treatment film including a component selected from a group consisting of silicon oxide, silicon nitride, and combinations thereof, is formed on the surface of the lower electrode. A dielectric film is formed on the pre-treatment film using a Ta precursor. The dielectric film includes a first dielectric layer deposited at a first temperature, which is selected from a designated temperature range. A second dielectric layer is deposited at a second temperature, which is different from the first temperature. A thermal treatment is thereafter performed on the dielectric film in an oxygen atmosphere.

There is a need, therefore, to provide a technique for producing thin film capacitors having sufficient capacitance and break down voltage, while minimizing current leakage.

SUMMARY OF THE INVENTION

A capacitor and a method of forming the same is disclosed, one embodiment of which includes depositing a multi-layer dielectric film between first and second spaced-apart electrodes. The multi-layer dielectric film includes first and second layers that have differing roughness. The layer of the dielectric film having the least amount of roughness is disposed adjacent to the first electrode. After depositing the second layer of the dielectric film adjacent to the first layer, the second layer is annealed. It is believed that the reduced roughness of the first layer reduces pin-hole formation in the second layer. In this manner, current leakage is prevented, or reduced, in the resulting thin-film capacitor, while providing suitable capacitance and breakdown voltage. An exemplary embodiment of the thin-film capacitor forms the dielectric material from silicon dioxide ($SiO_2$) and tantalum pentoxide ($Ta_2O_5$). To provide the thin-film capacitor with the desired operational characteristics, the layer of tantalum pentoxide is provided with a thickness that is approximately three times greater than the thickness of the silicon dioxide layer. To that end, in the exemplary method, the first electrode is formed by vapor deposition of phosphorous oxytrichloride ($POCl_3$). The layer of silicon dioxide is formed by thermal oxidation of silicon in oxygen. The layer of tantalum pentoxide is formed by sputtering tantalum (Ta) onto the layer of silicon dioxide in an oxygen rich ambient. Annealing then densities the tantalum oxide. Thereafter, the second electrode is formed by deposition of a layer consisting of aluminum, chromium, copper, titanium, titanium nitride, titungsten or a combination thereof.

These and other embodiments of the present invention, along with many of its advantages and features, are described in more detail in the text below and the attached figures.

DETAILED DESCRIPTION

Figure 1:
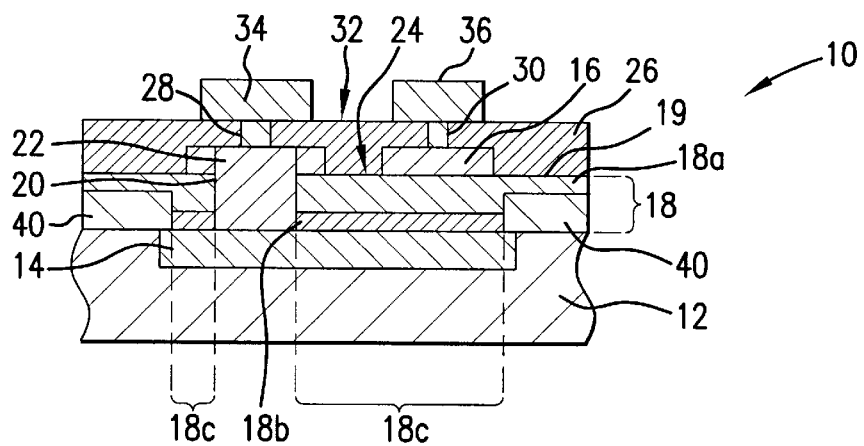
FIG. 1 is a cross-sectional view of an exemplary thin-film capacitor in accordance with the present invention.

FIG. 1 is a cross-sectional view of an exemplary thin-film capacitor 10 in accordance with the present invention that is formed atop of a substrate 12. Capacitor 10 includes a pair of spaced-apart electrodes 14 and 16, with a multi-layer dielectric film 18 disposed therebetween. A via 20 is formed through dielectric film 18 and extends from a surface 19 thereof, terminating proximate to electrode 14. A conductive contact 22 is formed in via 20 so as to extend from electrode 14 away from surface 24 of dielectric material 18. Contact 22 is formed adjacent to, but spaced-apart from, electrode 16. Formed adjacent to the capacitive structure is a dielectric layer that is typically formed from a layer of Benzocyclobutene (BCB), shown as BCB layer 26. First and second throughways 28 and 30 are formed in BCB layer 26. First throughway 28 extends from an upper surface 32 of BCB layer 26, terminating proximate to the contact 22, and second throughway 30 extends from upper surface 32, terminating proximate to electrode 16. A first metal interconnect 34 is formed in first throughway 28 and is in electrical communication with contact 22. A second metal interconnect 36 is formed in second throughway 30 and is in electrical communication with electrode 16.

In one example of capacitor 10, electrode 14 is formed from a conductive layer of diffused phosphorus. Electrode 16, contact 22 and metal interconnects 34 and 36 may be formed from any conductive material known in the semiconductor processing art, including aluminum (Al), chromium (Cr), copper (Cu), titanium (Ti), titanium nitride (TiN), tungsten (W), titungsten (TiW) or a combination thereof.

To provide superior operational characteristics of capacitor 10, dielectric film 18 includes a layer 18a of tantalum pentoxide ($Ta_2O_5$). Dielectric film 18 is formed as a multi-layer structure to overcome a problem encountered when manufacturing capacitor 10. Specifically, to achieve the desired capacitance and breakdown voltage with minimal leakage between the capacitor electrodes, it is beneficial to have an interfacial film between the silicon and the tantalum oxide. It is desired that this interfacial film have good integrity and a very smooth interface in the transition region. Thermal silicon oxide satisfies both of these requirements. It is a high integrity film with a very low pin hole density and minimal surface roughness at both the interface and the exposed top surface. These silicon oxide characteristics enable the sputter deposition of a high quality tantalum oxide film on the surface of the oxide film. The presence of a thin, dense, high quality, oxide film at the silicon interface will increase the capacitor breakdown voltage, and reduce the capacitor leakage current.

It is believed that the current leakage is due, in part, to the roughness of the grain boundary of tantalum pentoxide layer upon being densified by annealing. To overcome this problem dielectric film 18 includes a second layer of dielectric material, such as silicon dioxide ($SiO_2$) layer 18b. Silicon dioxide layer 18b is employed, because it has a roughness that is less than tantalum pentoxide layer 18a. It is believed that the reduced roughness presented by silicon dioxide layer 18b substantially reduces pin hole formation in the dielectric layer 18. As a result, the current leakage of the capacitor 10 is substantially reduced, if not eliminated. To maintain the advantageous characteristics provided by tantalum pentoxide layer 18a, it is desirable to minimize the thickness of silicon dioxide layer 18b. To that end, one embodiment of capacitor 10 provides a portion 18c of tantalum pentoxide layer 18a that superimposes silicon dioxide layer 18b with a thickness at least three time greater than the thickness of silicon dioxide layer 18b.

In an exemplary embodiment of capacitor 10, silicon dioxide layer 18b is approximately 50 Å thick and tantalum pentoxide layer 18a is approximately 150 Å thick. Electrode 14 is formed from a three-micron-deep diffusion of phosphorus providing a sheet resistivity of 2–3 ohms/$cm^2$. Electrode 16 and contact 22 are formed from one micron aluminum disposed atop of a titanium nitride layer barrier layer (not shown) BCB layer 26 is approximately 3 microns thick. Metal interconnects 34 and 36 are formed from copper with an adhesion film composed of either titanium, chrome, or titungsten (TiW). With this configuration capacitor 10 demonstrated a capacitance of approximately 270 to 300 nanofarad/$cm^2$ and a breakdown voltage in excess of 7 volts, with minimum current leakage.

Figure 2:
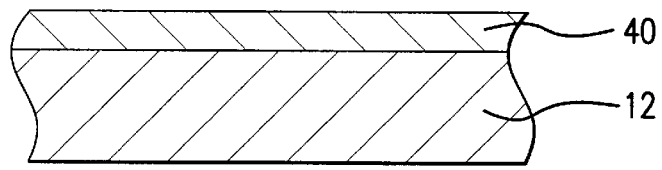
FIG. 2 is a cross-sectional view of a substrate, having a thermal oxide layer thereon, upon which the thin-film capacitor of FIG. 1 is fabricated.

Referring to FIGS. 1 and 2, the fabrication of capacitor 10 involves forming a thermal oxide layer 40 on substrate 12. Although substrate 12 may be formed from any suitable semiconductor material, in the present example substrate 12 is formed from silicon (Si). Therefore, the oxide layer comprises of silicon dioxide. Typically, the oxide layer is approximately 20,000 to 30,000 Å thick.

Figure 3:
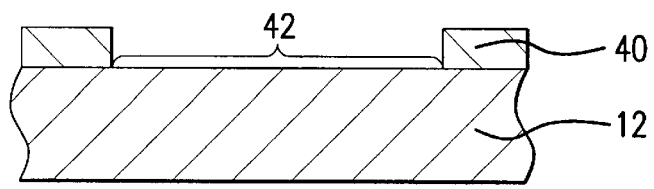
FIG. 3 is a cross-sectional view of the substrate shown in FIG. 2 with a section of the oxide layer removed.

Referring to FIGS. 1 and 3, a resist pattern (not shown) is disposed onto oxide layer 40, and an etching process is employed to remove an area of oxide layer 40, exposing a portion 42 on the surface of substrate 12, to facilitate formation of electrode 14. A buffered oxide etch (BOE) hydrofluoric acid etch process is an exemplary technique employed to remove the area of oxide layer 40, to expose portion 42. In such a process, the pattern oxide layer 40 is exposed to the BOE (buffered oxide etch) hydrofluoric acid etch for approximately 30 minutes. Thereafter, the resist (not shown) is removed and a phosphorus rich glass is grown on oxide layer 40 and and portion 42 via the reaction between $POCl_3$ and $O_2$ in the hot diffusion tube by chemical vapor deposition.

Figure 4:
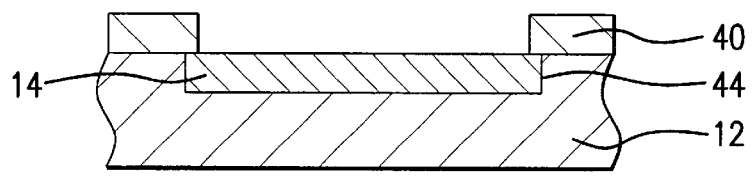
FIG. 4 is a cross-sectional view of the substrate shown in FIG. 3 showing diffused phosphorus region of the substrate.

Referring to FIGS. 1 and 4, after formation of the phosphorus rich glass on the surface of portions 40 and 42, the substrate is thermally baked at approximately 1000° C. for approximately two hours. This results in diffusion of the phosphorus from the phosphorus rich glass into a region 44 of substrate 12, thereby forming electrode 14. Electrode 14 is approximately three microns deep and extends completely over region 44 and partially under oxide layer 40 at the edge of the opening. Thereafter, the structure of FIG. 3 is exposed to a hydrofluoric acid (HF) solution to remove the surface rich phosphorus glass oxide that was the source for the phosphorus diffusion to form the bottom electrode. The concentration of hydrofluoric acid is 10:1, i.e., ten parts water to one part hydrofluoric acid.

Figure 5:
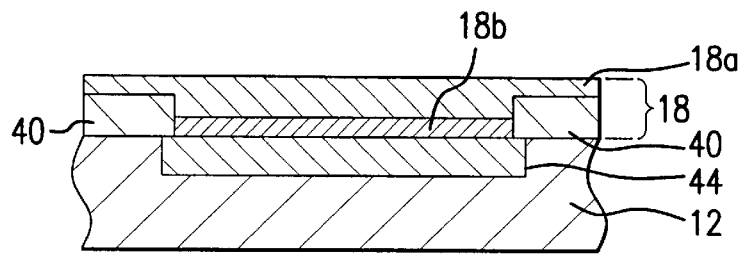
FIG. 5 is a cross-sectional view of the substrate shown in FIG. 4 with a multi-layer dielectric film disposed adjacent to the phosphorous diffusion region.

Referring to FIGS. 1 and 5, after removal of the phosphorus rich glass oxide with hydrofluoric acid, a layer of silicon dioxide 18b is thermally grown adjacent to the exposed surfaces of oxide layer 40 and region 44 via thermal oxidation of the exposed silicon. Specifically, layer 18b is grown in an environment of oxygen gas at approximately 850° C. to grow a 30–50 Å $SiO_2$ film. After thermal oxidation to form the 30–50 Å silicon dioxide layer 18b on the surface of region 44, tantalum metal is sputtered in an oxygen rich ambient in the sputter chamber to form a layer of tantalum pentoxide ($Ta_2O_5$) 18a. Tantalum pentoxide layer 18a has a thickness, in an area thereof that is coextensive with region 44, in the range of 90 to 150 Å. Tantalum pentoxide layer 18a is densified by subjecting the structure of FIG. 5 to temperatures in a range of 750° C. to 900° C. in a 20% oxygen/nitrogen mixture, thereby forming a multilayer dielectric film composed of thermal oxide ($SiO_2$) 18b, and tantalum pentoxide ($Ta_2O_5$) 18a.

Figure 6:
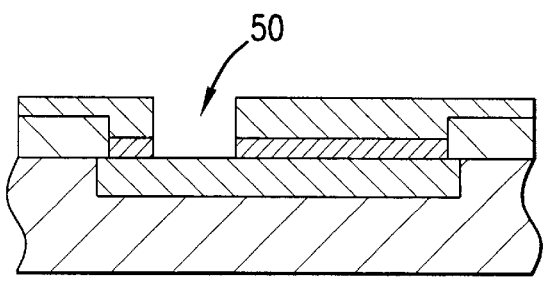
FIG. 6 is a cross-sectional view of the substrate shown in FIG. 5 showing a via etched therein, which extends through the dielectric and terminates proximate to the phosphorus diffusion region.
Figure 7:
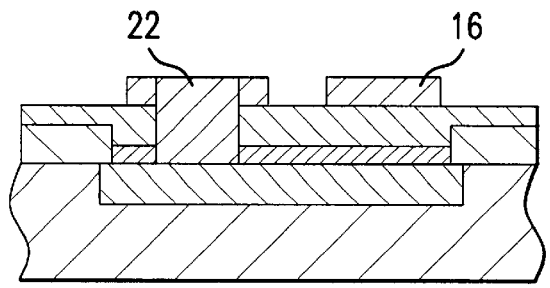
FIG. 7 is a cross-sectional view of the substrate shown in FIG. 6 with a contact and additional electrode formed thereon.
Figure 8:
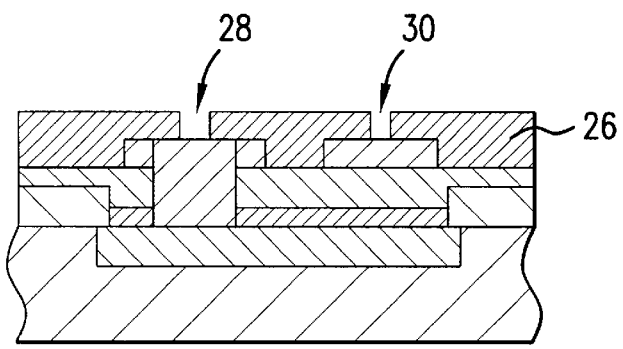
FIG. 8 is a cross-sectional view of the substrate shown in FIG. 7 with a layer of Benzocyclobutene (BCB) disposed atop of the contact, additional electrode and the dielectric film.

Referring to FIGS. 1 and 6, a mask (not shown) is disposed upon tantalum pentoxide layer 18a in preparation to form a via 50 employing a plasma etch process utilizing a fluorine plasma chemistry, i.e. $CHF_3$, $SF_6$, etc. This is followed by removal of the mask and subsequent deposition of a barrier film (not shown) formed from titanium nitride. Thereafter, an aluminum or copper layer is deposited, patterned by resist lithography, and etched to form contact 22 and electrode 16, shown in FIG. 7. After removal of resist, the barrier film in the field area is removed with a fluorine plasma etch. After removal of the barrier film in the field area a photosensitive film of BCB (Benzocyclobutene) is applied to the surface of the wafer. As shown in FIG. 8, BCB layer 26 is exposed and developed to form the via contacts 28 and 30 (throughways) to the top and bottom capacitor electrodes. BCB layer 26 is then semicured at a temperature of 210° C. in a nitrogen ambient. Following the BCB semicure a metal adhesion film (not shown) and a conductive metal film (not shown) are deposited and the metal pattern defined with standard photoresist lithography. The developed photoresist pattern is hard baked and the metal etched, thereby forming conductive interconnects 34 and 36. The resist (not shown) employed for the pattern is then removed.

Although the invention has been described in terms of specific embodiments, these embodiments are exemplary. Variations may be made to the embodiments as disclosed and still be within the scope of the invention. The invention should not be determined, therefore, based solely upon the foregoing description. Rather, the invention should be determined based upon the attached claims, including the full scope of equivalents thereof.

What is claimed is:

1. A method for manufacturing a capacitor on a semiconductor substrate, said method comprising:
    forming a first electrode by depositing an electrode forming layer on said substrate containing conductive material and diffusing said conductive material into said substrate;
    depositing a multi-layer dielectric film adjacent to said first electrode, with said dielectric film including first and second layers, said first layer being disposed adjacent to said first electrode and having a roughness associated therewith that is less than a roughness associated with said second layer; and
    forming a second electrode by depositing a conductive layer adjacent to said second layer.

2. The method as recited in claim 1 wherein depositing said dielectric film further includes growing said first layer by thermal oxidation to form silicon dioxide.

3. The method as recited in claim 1 wherein said first layer consists of a layer of silicon dioxide and said second layer consists of a layer of tantalum pentoxide, with said second layer having a thickness that is approximately three times greater than a thickness of said first layer.

4. The method as recited in claim 3 wherein said layer of silicon dioxide has a thickness in a range of 30 to 50 Å and said layer of tantalum pentoxide has a thickness in a range of 90 to 150 Å.

5. The method as recited in claim 1 wherein forming said first electrode further includes forming said electrode forming layer from phosphorous rich oxide glass.

6. The method as recited in claim 1 wherein forming said second electrode further includes forming said conductive layer from material selected from a group consisting of aluminum, chromium, copper, titanium, titanium nitride and ti-tungsten.

7. The method as recited in claim 1 further including forming a via extending from said first electrode and through said multi-layer dielectric material, with forming said second electrode further including depositing said conductive layer adjacent to said multi-layer dielectric film and said via and etching said conductive layer to form said second electrode and a contact, with said contact extending from said via, defining a capacitive structure.

8. The method as recited in claim 7 further including depositing a layer of Benzocyclobutene (BCB) adjacent to said capacitive structure and forming first and second throughways in said layer of BCB, with said first throughway extending to said second electrode and said second throughway extending to said contact and forming a first metal interconnect to extend in said first throughway to be in electrical communication with said second electrode and forming a second metal interconnect to extend in said second throughway to be in electrical communication with said contact.

9. A method for manufacturing a capacitor on a semiconductor substrate, said method comprising:
    forming a first electrode by depositing, on said substrate, an electrode forming layer of phosphorous rich oxide glass having phosphor elements and diffusing said phosphor elements into said substrate;
    growing, adjacent to said first electrode, a silicon oxide layer;
    forming a tantalum pentoxide layer adjacent to said silicon dioxide layer; and
    forming a second electrode by depositing a conductive layer adjacent to said tantalum containing layer.

10. The method as recited in claim 9 wherein said silicon oxide layer consists of a layer of silicon dioxide and said tantalum pentoxide layer has a thickness that is approximately three times greater than a thickness of said silicon oxide layer.

11. The method as recited in claim 10 wherein said silicon dioxide layer has a thickness in a range of 30 to 50 Å and said tantalum pentoxide layer has a thickness in a range of 90 to 150 Å.

12. The method as recited in claim 11 wherein forming said first electrode further includes growing a layer of phosphorus rich glass composed of silicon, phosphorus, and oxygen.

13. The method as recited in claim 12 wherein forming said second electrode further includes forming said conductive layer from material selected from a group consisting of aluminum, chromium, copper, titanium, titanium nitride and ti-tungsten.

14. The method as recited in claim 13 further including forming a via extending from said first electrode and through said multi-layer dielectric material, with forming said second electrode further including depositing said conductive layer adjacent to said multi-layer dielectric film and said via and etching said conductive layer to form said second electrode and a contact, with said contact extending from said via, defining a capacitive structure.

15. The method as recited in claim 14 further including depositing a layer of Benzocyclobutene (BCB) adjacent to said capacitive structure and forming first and second throughways in said layer of BCB, with said first throughway extending to said second electrode and said second throughway extending to said contact and forming a first metal interconnect to extend in said first throughway to be in electrical communication with said second electrode and forming a second metal interconnect to extend in said second throughway to be in electrical communication with said contact.

16. A method for manufacturing a capacitor on a semiconductor substrate, said method comprising:

forming a first electrode by depositing a layer of phosphorous rich oxide glass on said substrate;

depositing a multi-layer dielectric film adjacent to said first electrode, with said dielectric film including first and second layers, said first layer being disposed adjacent to said first electrode and having a roughness associated therewith that is less than a roughness associated with said second layer; and forming a second electrode by depositing a conductive layer adjacent to said second layer.

17. The method as recited in claim 16 wherein depositing said dielectric film further includes forming said first layer of silicon dioxide and forming said second layer of tantalum pentoxide, with said second layer having a thickness that is approximately three times greater than a thickness of said first layer.

18. The method as recited in claim 16 wherein said dielectric film having a capacitance and a breakdown voltage associated therewith and including first and second layers, with said first layer having a first thickness associated therewith and said second layer having a second thickness associated therewith, with said first and second thicknesses being established to minimize formation of pin holes while maximizing a contribution, by said second layer, to said capacitance and said breakdown voltage, said first thickness being in a range of 30 to 50 Å and said second thickness being in a range of 90 to 150 Å.

19. The method as recited in claim 16 wherein forming said first electrode further includes diffusing phosphor from said layer of phosphorous rich glass into said substrate and forming said second electrode further includes forming said conductive layer from material selected from a group consisting of aluminum, chromium, copper, titanium, titanium nitride and ti-tungsten.

20. The method as recited in claim 16 further including forming a via extending from said first electrode and through said multi-layer dielectric material, with forming said second electrode further including depositing said conductive layer adjacent to said multi-layer dielectric film and to fill via and etching said conductive layer to form said second electrode and a contact.

* * * * *